US008659088B2

(12) United States Patent
Ouchi

(10) Patent No.: US 8,659,088 B2
(45) Date of Patent: *Feb. 25, 2014

(54) SRAM CELL AND SRAM DEVICE

(75) Inventor: Shinichi Ouchi, Tsukuba (JP)

(73) Assignee: National Institute of Advanced Industrial Science and Technology, Tokyo (JP)

(*) Notice: Subject to any disclaimer, the term of this patent is extended or adjusted under 35 U.S.C. 154(b) by 546 days.

This patent is subject to a terminal disclaimer.

(21) Appl. No.: 12/934,845

(22) PCT Filed: Mar. 25, 2009

(86) PCT No.: PCT/JP2009/055951
§ 371 (c)(1),
(2), (4) Date: Sep. 27, 2010

(87) PCT Pub. No.: WO2009/119666
PCT Pub. Date: Oct. 1, 2009

(65) Prior Publication Data
US 2011/0024844 A1    Feb. 3, 2011

(30) Foreign Application Priority Data
Mar. 28, 2008    (JP) .................. 2008-088113

(51) Int. Cl.
*H01L 21/70*    (2006.01)
(52) U.S. Cl.
USPC .................. 257/368; 257/903; 257/E27.06
(58) Field of Classification Search
USPC ............. 257/903, 368, 329, 365, 369, E27.06
See application file for complete search history.

(56) References Cited

U.S. PATENT DOCUMENTS

| 8,040,717 B2* | 10/2011 | Ouchi et al. .................. 365/156 |
| 2005/0026377 A1 | 2/2005 | Kawasaki et al. |
| 2006/0068531 A1 | 3/2006 | Breitwisch et al. |

FOREIGN PATENT DOCUMENTS

| JP | 200226337 | 1/2002 |
| JP | 2005064459 | 3/2005 |
| JP | 2006511091 | 3/2006 |
| WO | WO 2008069377 | 6/2008 |
| WO | WO 2008081740 | 8/2008 |

OTHER PUBLICATIONS

H. Kawasaki et al., "Embedded Bulk FinFET SRAM Cell Technology with Planar FET Peripheral Circuit for hp32 nm node and beyond", 2006 Symposium on VLSI Technology Digest of Technical Papers, 2006 IEEE, pp. 86-87.

* cited by examiner

*Primary Examiner* — Laura M Menz
*Assistant Examiner* — Candice Y Chan
(74) *Attorney, Agent, or Firm* — Bacon & Thomas, PLLC

(57) ABSTRACT

An SRAM cell includes six four-terminal double gate FETs formed on four semiconductor thin film plates, in which first and third FETs, fourth and fifth FETs, third and fourth FETs, and second and sixth FETs neighbor each other and logic signal input gates thereof are formed on facing side surfaces of respective semiconductor thin film plates; the second and sixth FETs sandwich second and third plates; the threshold voltage control gates of the second, third, fourth, and sixth FETs are connected in common to a first bias wiring; threshold voltage control gates of the first and fifth FETs are connected in common to a second bias wiring; and the word line and the first and second bias wirings are arranged in a direction perpendicular to the alignment direction of the first to the fourth plates.

8 Claims, 4 Drawing Sheets

SRAM CELL AND SRAM DEVICE

TECHNICAL FIELD

The present invention relates to an SRAM (Static Random Access Memory) cell and an SRAM device.

BACKGROUND ART

Conventionally, an SRAM cell is fabricated by using a planar type MOS field effect transistor (Metal-Oxide-Silicon Field-Effect Transistor) on a bulk type or an SOI (Silicon On Insulator) silicon substrate. However, in near future, it will become difficult to suppress the short channel effect in a bulk planar type MOS field effect transistor, which causes an increase of leakage current. As a method to avoid this problem, Non-Patent Document 1 suggests fabricating an SRAM cell by using a four-terminal double gate FET (Field-Effect Transistor).

This SRAM cell is realized with an area of 118 $F^2$, where F denotes a half length of the pitch of the metallic wiring in the first layer. However, no consideration is taken in this SRAM cell from a view point of reducing standby power consumption. An SRAM cell circuit designed from a point of view of reducing the standby power consumption, the circuit will be, for example, as shown in FIG. 5. In the SRAM cell shown in FIG. 5, the circuit is consisting of NMOS and PMOS four-terminal double gate FETs. Current flowing through the NMOS and PMOS transistors is drastically reduced by raising the threshold voltage by operation of the threshold voltage control gates on standby. However, an area of the SRAM cell becomes more than 160 $F^2$ if the SRAM cell shown in FIG. 5 is implemented in the usual way such as disclosed in Non-Patent Document 1.

This figure cannot satisfy a requirement for realizing a high density integration of SRAM device with small area by using four-terminal double-gate-FET-SRAM cells. Hence, in order to improve the performance of the four-terminal double gate FET SRAM cell, the present inventor proposed a following SRAM cell arrangement in Patent Document 1.

An SRAM cell includes first to fourth semiconductor thin plates standing on a single substrate and sequentially arranged parallel to each other. A first four-terminal double gate FET (M1) with a first conduction type is formed on the first semiconductor thin plate, second and a third four-terminal double gate FETs (M3 and M2) with a second conduction type connected in series to each other are formed on the second semiconductor thin plate, fourth and fifth four-terminal double gate FETs (M6 and M4) with the second conduction type connected in series to each other are formed on the third semiconductor thin plate, and a sixth four-terminal double gate FET (M5) with the first conduction type is formed on the fourth semiconductor thin plate, respectively. The third and fourth four-terminal double gate FETs (M2, M6) constitute select transistors with logic signal input gates connected to a word line, and the first and second four-terminal double gate FETs (M1, M3) and the fifth and sixth four-terminal double gate FETs (M4, M5) respectively constitute cross-coupled complementary inverters to realize a flip-flop. Logic signal input gates of the first and fifth four-terminal double gate FETs (M1, M5) are arranged on the side facing to the second and the third semiconductor thin plates respectively. Threshold voltage control gates of the second and third four-terminal double gate FETs (M3, M2) and threshold voltage control gates of the fourth and fifth four-terminal double gate FETs (M6, M4) are arranged to face to each other, and each of these threshold control gates are connected in common to a first bias wiring. Threshold control gates of the first and sixth double gate FETs (M1, M5) are connected in common to a second bias wiring, and the word line and the first and second bias wirings are arranged in a direction perpendicular to the alignment direction of the first to the fourth semiconductor thin plates.

FIG. 6 is a schematic diagram illustrating a device arrangement method of the SRAM cell disclosed in Patent Document 1. FIG. 7 is a circuit diagram modified corresponding to the arrangement of the SRAM cell.

The SRAM cell arrangement disclosed in Patent Document 1 has following features.

1. Surfaces of the semiconductor thin plates facing with each other on which FETs with the conduction type different from each other are implemented are used as logic signal input gates, thereby enabling to reduce numbers of contacts when contacts are connected to wires in a layer upper than the first layer.

2. Surfaces of the semiconductor thin plates facing with each other on which FETs with the same conduction type are implemented are used as threshold gates, thereby enabling to reduce numbers of contacts when contacts are connected from wires in the upper layers.

3. When a word line WL is arranged in a direction perpendicular to the direction of semiconductor thin plates, contacts connected to WL on which a row selection signal is applied are arranged on a straight line, thereby making connection between WL and the contacts efficient.

4. Since the contacts from wires providing a bias to control the threshold voltage are aligned on the straight line parallel with WL, the layout becomes simple, and a row-by-row threshold voltage control synchronized to the change in the voltage on the WL is realized.

5. Since the SRAM cell is arranged repeatedly in a cell array with a translational symmetry to the WL direction, with a line symmetry to the BL direction with respect to a boundary line between the neighboring cells, contacts for power supply voltage $V_{DD}$, and $V_{SS}$, contacts of BL, and BL~, and gate contacts for the threshold voltage control signal applied to M1 and M5 can be shared between cells.

By providing the above features, the SRAM cell in Patent Document 1 was successful in reducing the SRAM cell area down to 144 $F^2$.

In order to realize an SRAM cell using the four-terminal double gate FETs with smaller area and to realize a highly integrated SRAM device, this figure, however is not sufficient.

Patent Document 1: WO2008/081740.
Patent Document 2: WO2008/069277.
Non-Patent Document 1: H. Kawasaki et al., "Embedded Bulk FinFET SRAM Cell Technology with Planar FET Peripheral Circuit for hp32 nm node and beyond", 2006 Symposium on VLSI Technology Papers, P. 86-87 (2006).

DISCLOSURE OF INVENTION

Subjects to be Solved by the Invention

Therefore, the subject of the present invention is to solve the above problem and to realize a highly integrated SRAM cell by realizing an SRAM cell using the four-terminal double gate FETs with smaller area.

Means to Solve the Subject

The above subject can be solved by following means.

(1) An SRAM cell comprising a first to a fourth semiconductor thin plates standing on a single substrate and sequentially ranged parallel to each other, on the first semiconductor thin plate a first four-terminal double gate FET with a first conduction type and a second four-terminal double gate FET with a second conduction type being formed and being connected in series to each other, on the second semiconductor thin plate a third four-terminal double gate FET with the second conduction type being formed, on the third semiconductor thin plate a fourth four-terminal double gate FET with the second conduction type being formed, on the fourth semiconductor thin plate a fifth four-terminal double gate FET with the first conduction type and a sixth four-terminal double gate FET with the second conduction type being formed and being connected in series to each other, wherein the second and sixth four-terminal double gate FETs constitute select transistors with logic signal input gates thereof being connected to a word line, and wherein the first and third four-terminal double gate FETs and the fourth and the fifth four-terminal double gate FETs respectively constitute cross-coupled complementary inverters to realize a flip-flop, the SRAM cell being characterized in that the first four-terminal double gate FET and the third four-terminal double gate FET are neighboring with each other and logic signal input gates thereof are formed on the side surfaces facing to each other of the respective semiconductor thin plates; the fourth and fifth four-terminal double gate FETs and the fifth four-terminal double gate FET are neighboring with each other and logic input gates thereof are formed on the side surfaces facing to each other of the respective semiconductor thin plates; the third four-terminal double gate FET and the fourth four-terminal double gate FET are neighboring with each other and threshold voltage control gates thereof are formed on the side surfaces facing to each other of the respective semiconductor thin plates; the second four-terminal double gate FET and the sixth four-terminal double gate FET are neighboring with each other sandwiching the second and the third semiconductor thin plates and threshold voltage control gates thereof being formed on side surfaces facing to each other of the respective semiconductor thin plate; the threshold voltage control gates of the second, third, fourth, and sixth four-terminal double gate FETs are connected in common to a first bias wiring; threshold voltage control gates of the first and fifth four-terminal double gate FETs are connected in common to a second bias wiring; the word line and the first and second bias wires are arranged in a direction perpendicular to the alignment direction of the first to fourth semiconductor thin plates.

(2) The SRAM cell according to (1) characterized in that the first and fifth four-terminal double gate FETs are p-channel FETs.

(3) An SRAM device characterized in that a plurality of the SRAM cells according to (1) and (2) are arranged with line symmetry to a direction of arrangement of the first to the fourth semiconductor thin plates.

(4) An SRAM device characterized in that a plurality of the SRAM cells according to (1) to (3) are arranged with line symmetry to a direction of the bit line.

Effectiveness of the Invention

In FIGS. 6 and 7 corresponding to Patent Document 1, a wiring presents between M2 and M6 increases spacing between M3 and M4. In the SRAM cell according to the present invention, a space for wiring between the second and sixth n-channel FETs is preserved, and the cell area can be saved and the cell with an area of 128 $F^2$ can be realized.

BEST MODE FOR CARRYING OUT THE INVENTION

Figure 6:
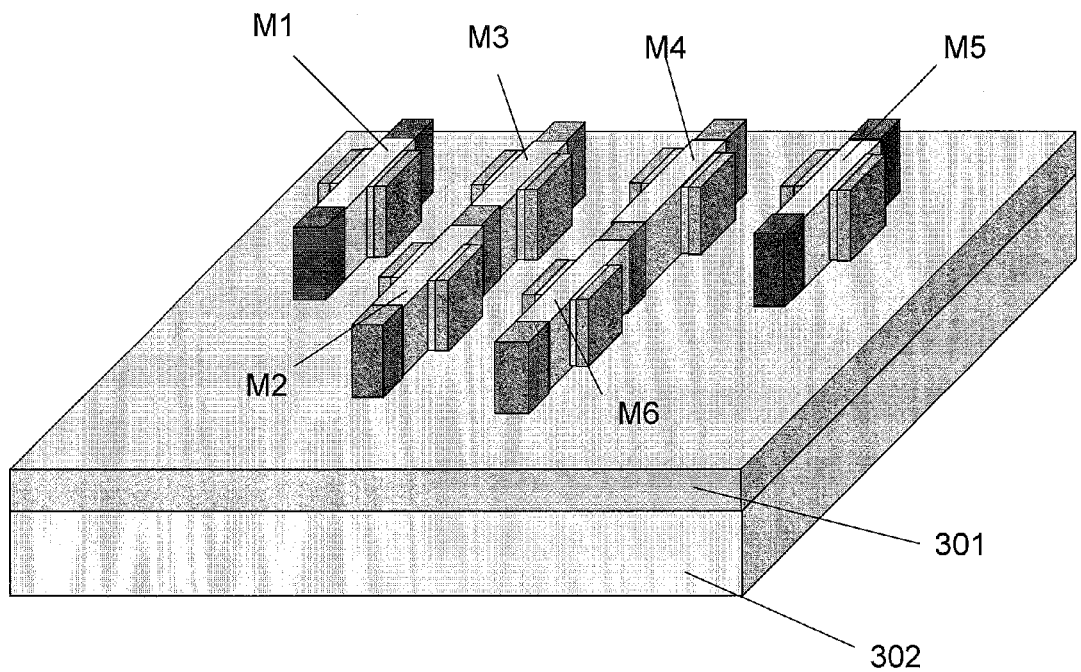
FIG. 6 is a schematic diagram of device arrangement in an SRAM cell.
Figure 7:
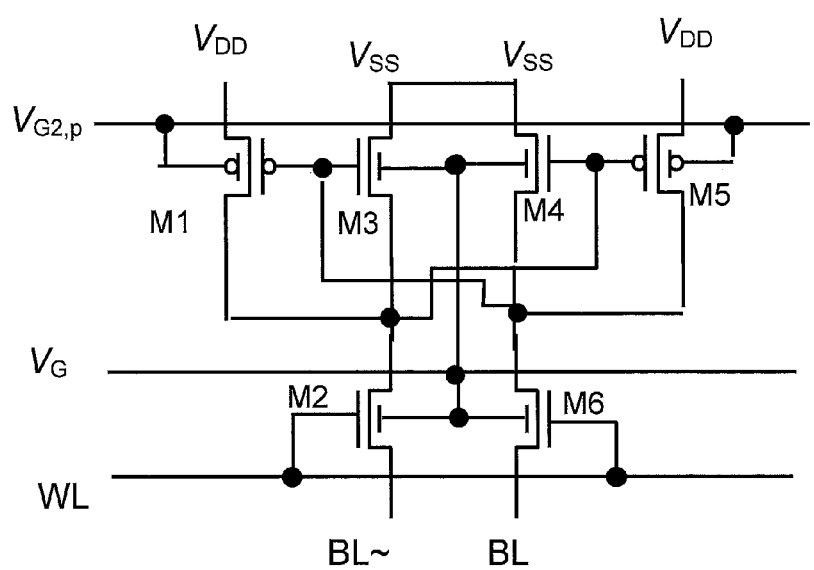
FIG. 7 is a circuit diagram of the SRAM cell circuit shown in FIG. 5 modified so as to correspond to the SRAM cell arrangement shown in Patent Document 1.

Although configurations of a circuit and its peripheral circuit configuration disclosed in the present invention are the same as those disclosed in Patent Document 1 as shown in FIGS. 6 and 7, and the circuit works if the circuit disclosed in, for example, Patent Document 2 is adopted, the SRAM cell disclosed in the present invention has a structure as shown in, for example, FIGS. 1 to 4 which is different from that disclosed in Patent Document 1.

Detailed structure of the SRAM cell shown in FIGS. 1 to 4 is as follows.

Figure 1:
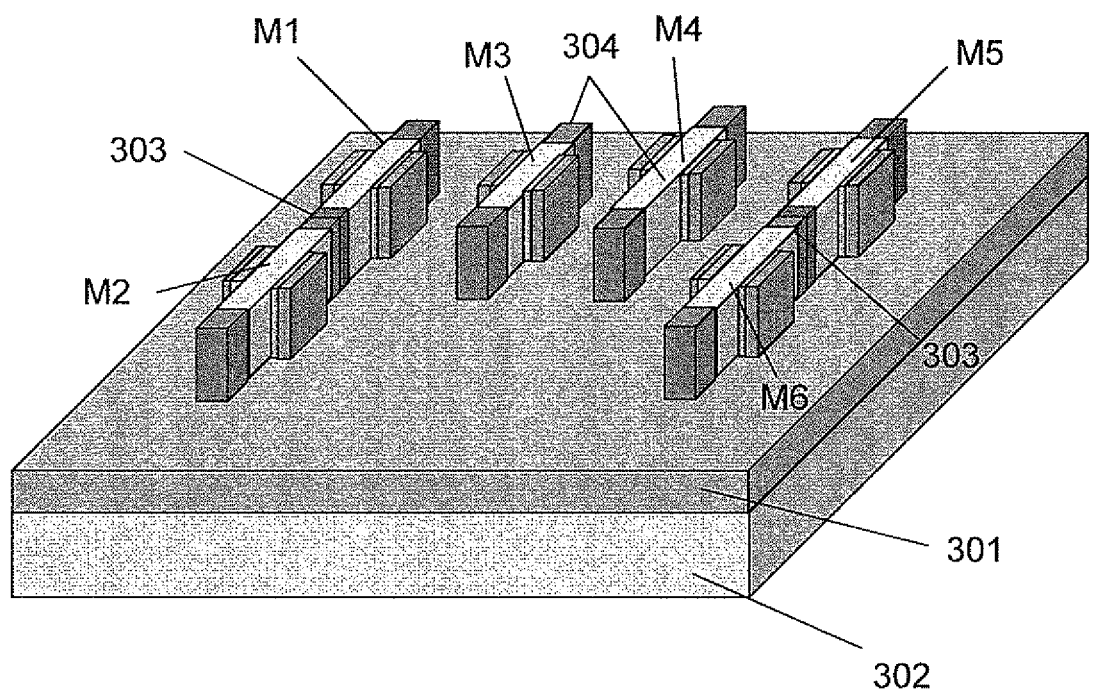
FIG. 1 is a schematic diagram of device arrangement in the SRAM cell according to the present invention.

FIG. 1 is a schematic diagram illustrating an arrangement method of six four-terminal double gate FETs (M1 to M6) configuring an SRAM cell.

The SRAM cell includes a first to fourth semiconductor thin plates standing on a single substrate and sequentially arranged parallel to each other. A first four-terminal double gate FET (M1) with a first conduction type and a second four-terminal double gate FET (M2) with a second conduction type are formed on the first semiconductor thin plate and are connected in series to each other, a third four-terminal double gate FET (M3) with the second conduction type is formed on the second semiconductor thin plate, a fourth four-terminal double gate FET (M4) with the second conduction type is formed on the third semiconductor thin plate, a fifth four-terminal double gate FET (M5) with the first conduction type and a sixth four-terminal double gate FET (M6) with the second conduction type are formed on the fourth semiconductor thin plate and are connected in series to each other. In this embodiment, the first conduction type four-terminal double gate FETs (M2 to M4 and M6) are n-channel four-terminal double gate FETs, and the second conduction type four-terminal double gate FETs (M1 and M5) are p-channel four-terminal double gate FETs.

Figure 2:
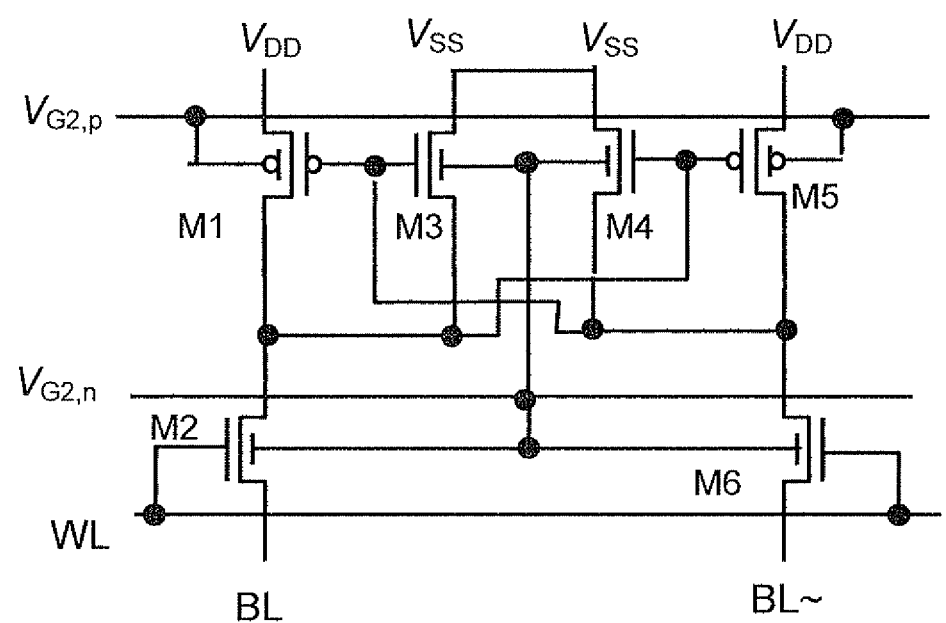
FIG. 2 is a modified version of a circuit diagram so as to correspond to the device arrangement of the SRAM cell according to the present invention.

As will be understood from FIG. 2, a circuit diagram being a modified version of the circuit configuration shown in FIG. 7 so as to correspond to the arrangement of the SRAM cell disclosed in the present invention, and a schematic diagram FIG. 1, the second and sixth four-terminal double gate FETs (M2 and M6) constitute select transistors with logic input gates thereof being connected to a word line. The first and third four-terminal double gate FETs (M1 and M3) and the fourth and fifth four-terminal double gate FETs (M4 and M5) respectively constitute cross-coupled complementary inverters to realize a flip-flop. The first four-terminal double gate FET (M1) and the third four-terminal double gate FET (M3) are neighboring with each other and logic signal input gates thereof are formed on the side surfaces facing to each other of the respective semiconductor thin plates; the fourth four-terminal double gate FET (M4) and the fifth four-terminal double gate FET (M5) are neighboring with each other and logic input gates thereof are formed on the side surfaces facing to each other of the respective semiconductor thin plates; the third double gate FET (M3) and the fourth four-terminal double gate FET (M4) are neighboring with each other and threshold voltage control gates thereof are formed on the side surfaces facing to each other of the respective semiconductor thin plates; the second four-terminal double gate FET (M2) and the sixth four-terminal double gate FET (M6) are neighboring with each other sandwiching the second and the third semiconductor thin plates and threshold voltage control gates thereof being formed on side surfaces facing to each other of the respective semiconductor thin plate; the threshold voltage control gates of the second, third, fourth, and sixth four-terminal double gate FETs (M2, M3, M4 and M6) are connected in common to a first bias wiring; threshold voltage control gates of the first and fifth four-terminal double gate FETs (M1 and M5) are connected in common to a second bias wiring; the word line and the first and the second bias wirings are arranged in a direction perpendicular to the alignment direction of the first to fourth semiconductor thin plates.

Figure 3:
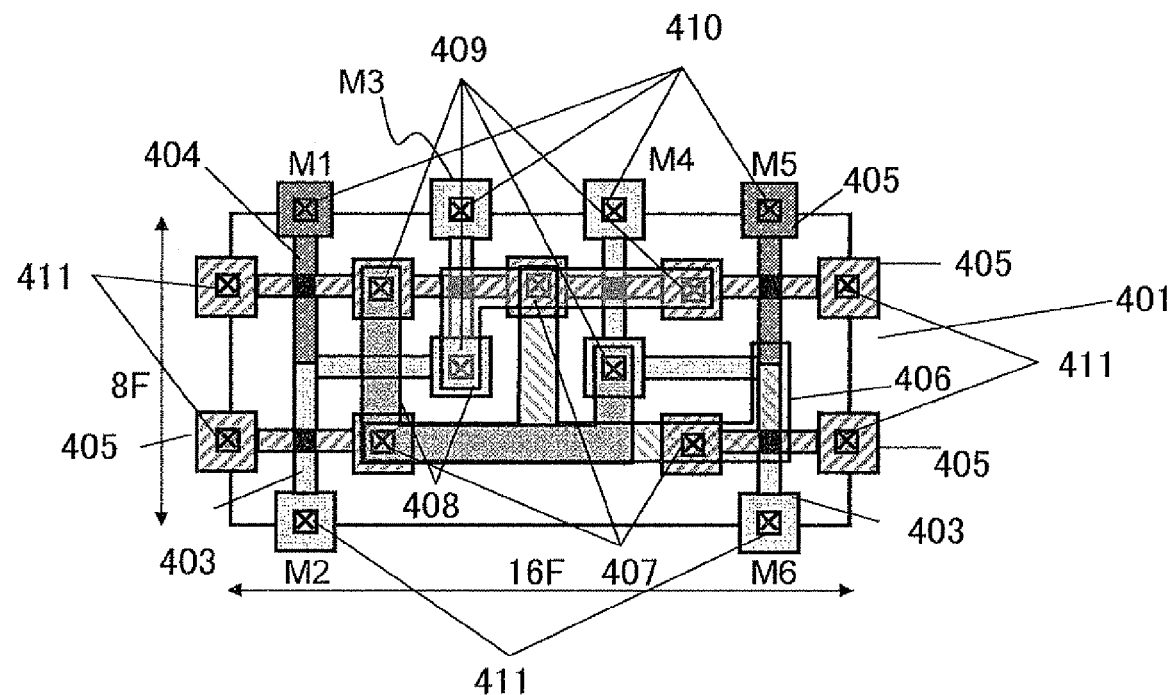
FIG. 3 shows a wiring configuration (the first and second layers).
Figure 4:
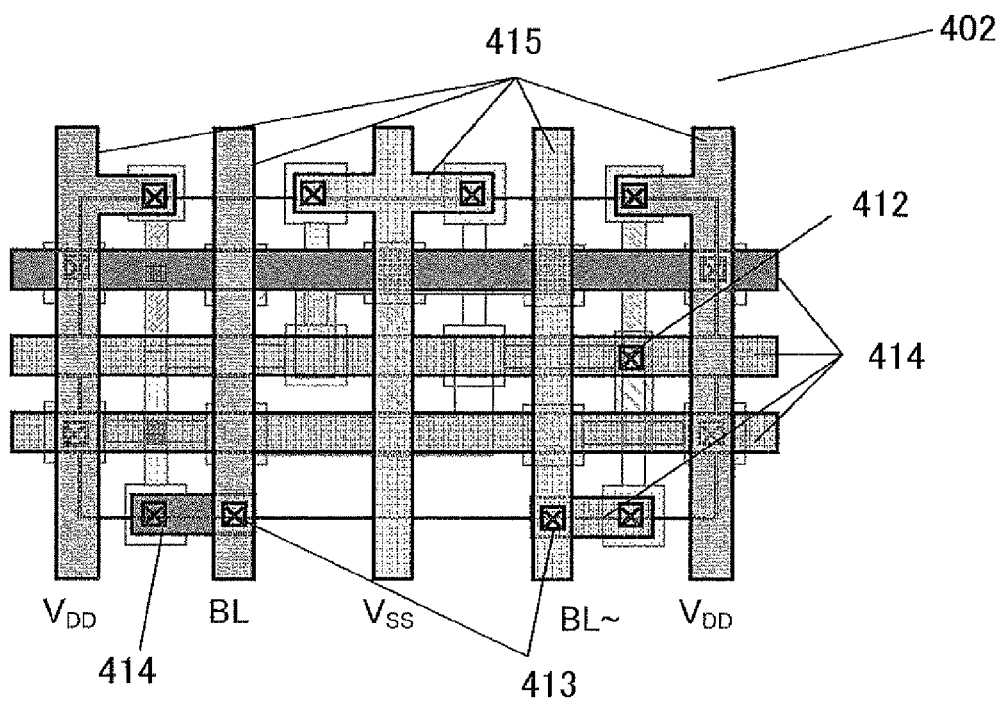
FIG. 4 shows a wiring configuration (the third and fourth layers).
Figure 5:
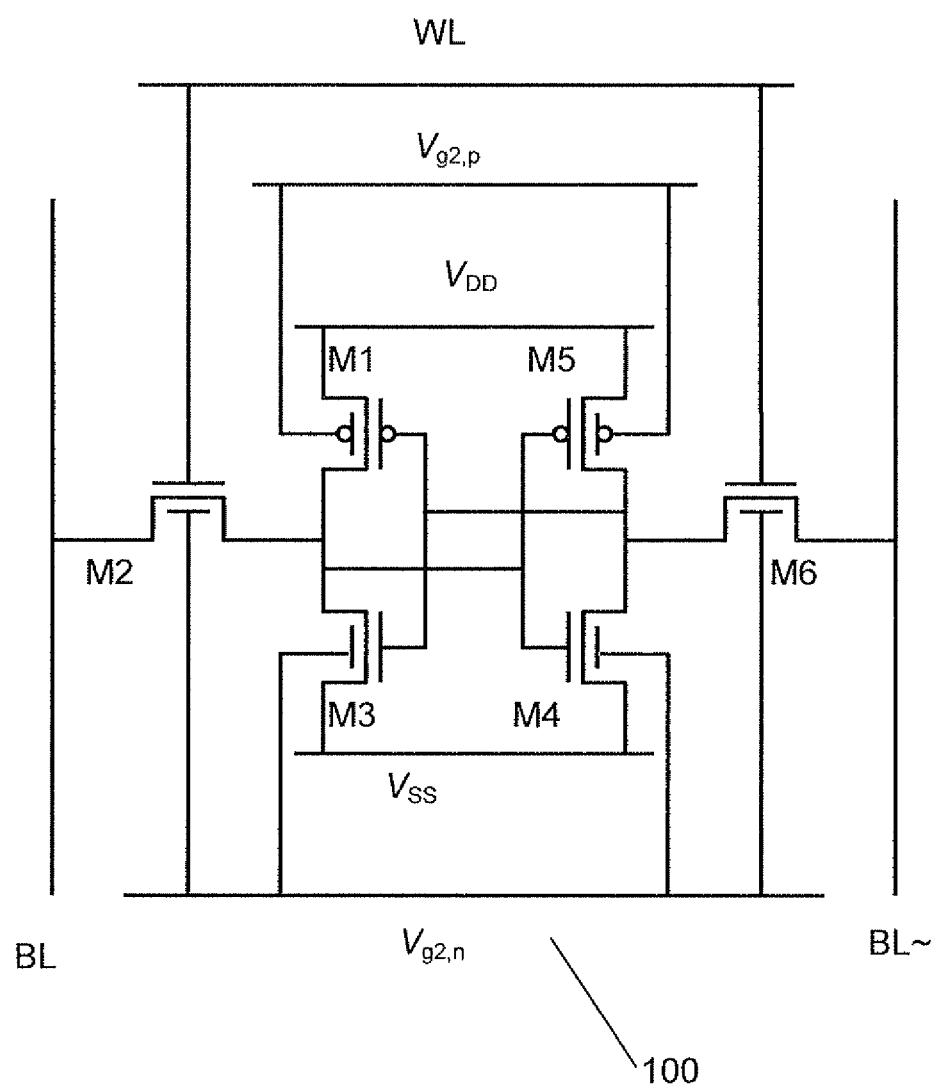
FIG. 5 shows a circuit diagram of an SRAM cell for reducing standby power consumption.

FIG. 3 is a diagram illustrating wiring arrangement of the SRAM cell in the first and second layers, and FIG. 4 is a diagram illustrating wiring arrangement of the SRAM cell in the third and fourth layers. As shown in FIG. 3, this SRAM cell is 8 F long in the vertical direction and 16 F in the horizontal direction with a cell area of 128 $F^2$, where F is equal to half length of the metal wiring pitch in the first layer.

Furthermore, although not shown in Figures, an SRAM device is configured by arranging a plurality of the SRAM cells according to the present invention with line symmetry to the alignment direction of the first to fourth semiconductor thin plates and with line symmetry to the direction of the bit line.

Unlike the SRAM cell according to Patent Document 1 as shown in FIGS. 1 and 2, in the SRAM cell according to the present invention four-terminal double gate FETs with different polarities, i.e., both n- and p-channel, are implemented on each of the first and fourth semiconductor thin plates 303. Since a wiring space is preserved between the second and sixth n-channel four-terminal double gate FETs (M2 and M6) as can be seen in the schematic diagram FIG. 1, it is enabled to save the cell area more to arrange the cell with a cell area of 128 $F^2$. By utilizing the SRAM cell according to the present invention, a highly integrated SRAM device can be realized.

The invention claimed is:

1. An SRAM cell comprising a first, second, third and fourth semiconductor thin plates standing on a single substrate and sequentially arranged parallel to each other, on the first semiconductor thin plate a first four-terminal double gate FET with a first conduction type and a second four-terminal double gate FET with a second conduction type being formed and connected in series to each other, on the second semiconductor thin plate a third four-terminal double gate FET with the second conduction type being formed, on the third semiconductor thin plate a fourth four-terminal double gate FET with the second conduction type being formed, on the fourth semiconductor thin plate a fifth four-terminal double gate FET with the first conduction type and a sixth four-terminal double gate FET with the second conduction type being formed and being connected in series to each other, wherein the second and sixth four-terminal double gate FETs constitute select transistors with logic signal input gates thereof being connected to a word line, and wherein the first and third four-terminal double gate FETs and the fourth and the fifth four-terminal double gate FETs respectively constitute cross-coupled complementary inverters to realize a flip-flop, the SRAM cell having the first four-terminal double gate FET and the third four-terminal double gate FET neighboring each other and wherein logic signal input gates thereof are formed on the side surfaces facing the respective semiconductor thin plates; the fourth four-terminal double gate FET and the fifth four-terminal double gate FET are neighboring with each other and logic input gates thereof are formed on the side surfaces facing the respective semiconductor thin plates; the third four-terminal double gate FET and the fourth four-terminal double gate FET are neighboring with each other and threshold voltage control gates thereof are formed on the side surfaces facing the respective semiconductor thin plates; the second four-terminal double gate FET and the sixth four-terminal double gate FET are neighboring with each other sandwiching the second and third semiconductor thin plates and threshold voltage control gates thereof are formed on side surfaces facing the respective semiconductor thin plate; the threshold voltage control gates of the second, third, fourth, and sixth four-terminal double gate FETs are connected in common to a first bias wiring; threshold voltage control gates of the first and the fifth four-terminal double gate FETs are connected in common to a second bias wiring; the word line and the first and the second bias wirings are arranged in a direction perpendicular to the arrangement direction of the first, second, third and fourth semiconductor thin plates.

2. The SRAM cell according to claim 1, wherein the first and fifth four-terminal double gate FETs are p-channel FETs.

3. An SRAM device wherein a plurality of the SRAM cells according to claim 2 are arranged with line symmetry to a direction of the bit line.

4. An SRAM device wherein a plurality of the SRAM cells in accordance with claim 1 are arranged with line symmetry to a direction of arrangement of the first, second, third and fourth semiconductor thin plates.

5. An SRAM device wherein a plurality of the SRAM cells according to claim 4 are arranged with line symmetry to a direction of the bit line.

6. An SRAM device wherein a plurality of the SRAM cells according to claim 1 are arranged with line symmetry to a direction of the bit line.

7. An SRAM device wherein a plurality of the SRAM cells in accordance with claim 2 are arranged with line symmetry to a direction of arrangement of the first, second, third and fourth semiconductor thin plates.

8. An SRAM device wherein a plurality of the SRAM cells according to claim 7 are arranged with line symmetry to a direction of the bit line.

* * * * *